United States Patent [19]
Schwalke et al.

[11] Patent Number: 5,882,965
[45] Date of Patent: Mar. 16, 1999

[54] PROCESS FOR MANUFACTURING AN INTEGRATED CMOS CIRCUIT

[75] Inventors: Udo Schwalke, Heldenstein; Martin Kerber, München, both of Germany

[73] Assignee: Siemens Aktiengesellschaft, Munich, Germany

[21] Appl. No.: 983,263
[22] PCT Filed: Jul. 4, 1996
[86] PCT No.: PCT/DE96/01202
 § 371 Date: Jan. 9, 1998
 § 102(e) Date: Jan. 9, 1998
[87] PCT Pub. No.: WO97/03462
 PCT Pub. Date: Jan. 30, 1997

[30] Foreign Application Priority Data

Jul. 10, 1995 [DE] Germany ................. 195 25 069.9

[51] Int. Cl.⁶ .................................. H01L 21/8238
[52] U.S. Cl. ..................... 438/227; 438/96; 438/488; 438/659; 438/660; 438/618; 438/669; 438/684; 257/369
[58] Field of Search .................... 438/199, 233, 438/227, 647, 669, 659, 660, 96, 488, 684, 618, 228; 257/369

[56] References Cited

U.S. PATENT DOCUMENTS 5,652,183  7/1997  Fujii .................................. 437/200
5,705,845  1/1998  Fujii .................................. 257/412

FOREIGN PATENT DOCUMENTS 0 337 481 A3  10/1989  European Pat. Off. .
0 660 394 A1  6/1995  European Pat. Off. .

OTHER PUBLICATIONS

Takenaka et al. "High Mobility Poly–Si–TFTs Using Solid Phase Crystallized a–Si Films Deposited by Plasma Enhanced Chemical Vapor Deposition", Extended Abstracts of the 22$^{nd}$ (1990 International) Conference on Solid State Devices and Materials, Sendai, 1990, pp. 955–958.

Lee et al. "New Robust n⁺/p⁺ Dual–Gate CMOS Technology Optimized for Low Power Operation" International Journal of High Speed Electronics and Systems, vol. 5, No. 2 Jan. 1994 135–143.

Parrillo "Process and Device Consideration for Micron and Submicron CMOS Technology", Motorola, Inc. IEDM 85, 1985.

Wong et al. "Doping of N⁺ and P⁺ Polysilicon in a Dual–Gate CMOS Process" IBM Research Division, T.J. Watson Research Center, 1988.

Seiichi, Patent Abstracts of Japan, Publication No. JP7302844, Publicaton Date Nov. 14, 1995, "Dual Gate Structured Complementary MIS Semiconductor Device".

Taro, Patent Abstracts of Japan, Publication No. JP8031947, Publication Date Feb. 2, 1996, "CMOS Semiconductor Device and its Manufacture".

Primary Examiner—Michael Trinh
Assistant Examiner—Long Pham
Attorney, Agent, or Firm—Hill & Simpson

[57] ABSTRACT

In the production of a dual work function CMOS circuit, a polysilicon layer is produced for the purpose of forming a gate structure, the average grain diameter of which polysilicon layer is greater than the minimum extent in the gate structure, in order to suppress lateral dopant diffusion. In particular, a constriction having a width less than the average grain diameter is produced in the gate structure.

7 Claims, 6 Drawing Sheets

PROCESS FOR MANUFACTURING AN INTEGRATED CMOS CIRCUIT

BACKGROUND OF THE INVENTION

1. Field of the Invention

The present invention is based on the problem of specifying an improved method for producing an integrated CMOS circuit using dual work function gate technology in which lateral dopant diffusion is suppressed and which can be carried out with reduced process complexity compared with known solutions.

2. Description of the Prior Art

Both n-channel MOS transistors and p-channel MOS transistors are used in CMOS logic circuits; for example, in inventors. Electrical connections between gate electrodes of p-channel MOS transistors and n-channel MOS transistors are, in this case, very often realized in a gate plane which is formed by structuring a layer and which comprises, in addition to the gate electrodes, connection elements between the gate electrodes. It is very often the case that the gate electrodes and the connection elements between the gate electrodes are formed as a continuous gate line. In CMOS circuits which are operated with a supply voltage of 5 volts, the gate structure is usually formed from $n^+$-doped polysilicon or polycide.

In CMOS circuits for low-voltage/low-power applications which are operated with a supply voltage of <3 volts, the MOS transistors are optimized such that they have threshold voltages $|V_{th}|<0.5$ volt in conjunction with low leakage currents. The associated high requirements on the short-channel behavior of the MOS transistors are satisfied by the use of dual work function gate technology with an optimized gate work function. Dual work function gate technology is understood to mean the fact that the gate electrode of the n-channel MOS transistors is $n^+$-doped and the gate electrode of the p-channel MOS transistors is $p^+$-doped. Owing to this different doping in the gate electrodes for the n-channel MOS transistors and the p-channel MOS transistors, there is the risk of lateral dopant diffusion in the case of a gate structure having a continuous gate line which connects differently doped gate electrodes (see, for example, L. C. Parrillo, IEDM '85, p. 398).

The electrical properties, for example the threshold voltage $V_th$, of the MOS transistors depend on the gate doping. Lateral dopant diffusion leads to a change in the gate doping and thus to undesirable, uncontrollable parameter shifts. In the extreme case, it is possible for reverse doping of the gate electrodes to occur, and hence total failure of the components. Furthermore, in the connection between $n^+$-doped gate electrodes and $p^+$-doped gate electrodes, it is necessary, with regard to a low bulk resistance, that $n^+$-doped regions and $p^+$-doped regions adjoin one another directly since otherwise a space charge zone forms.

In order to suppress lateral dopant diffusion in dual work function gate technology, it has been proposed (see, for example, D. C. H. Yu et al., Int. J. High Speed Electronics and Systems, Vol. 5, p. 135, 1994) not to use any continuous connections made of polysilicon between differently doped gate electrodes. Instead, the gate line made of polysilicon is interrupted and is electrically conductively connected via a metal bridge made of aluminum, for example. As an alternative, after the interruption of the gate line, a suitable metallic conductor (TiN, WI $WSi_2$) is deposited and structured. This solution is complicated and in some instances requires additional space for contact-making and metallization.

Furthermore, it has been proposed (see C. Y. Wong et al., IEDM '88, p. 238) to produce, in dual work function gate technology, planar source/drain regions and the correspondingly doped gate electrodes by implantation with the same dopant. For this purpose, the implantations are carried out before the structuring of the gate electrodes. With regard to planar source/drain regions, limitations must be observed in the case of the implantation doses and the thermal loading. However, this leads to a narrow process window; for example, during dopant activation in the gate electrode and during planarization reflow.

SUMMARY OF THE INVENTION

In a method according to the present invention, a polysilicon layer produced for the purpose of forming the gate structure. The average grain diameter in the polysilicon layer is greater than the minimum extent in the gate plane. The invention makes use of the insight that lateral dopant diffusion in the gate structure is principally caused by grain boundary diffusion in the polycrystalline silicon. This grain boundary diffusion is extremely rapid. For example, boron diffusion in monocrystalline silicon is less than along the silicon grain boundaries in polycrystalline silicon by a factor of 100 to 1000.

By using a polysilicon layer having an average grain diameter greater than the minimum dimensions in the gate structure, the grain boundary density in the region of the minimum dimensions in the polysilicon layer is drastically reduced in the method according to the present invention. In this region, diffusion takes place only in the silicon grains at a diffusion rate similar to that in monocrystalline silicon. The polysilicon layer is preferably produced by deposition of an amorphous silicon layer and subsequent solid phase crystallization, as is disclosed for example in S. Takenaka et al., SSDM '90, p. 955. The minimum dimension may be the web width of the connection between two gate electrodes, for example.

A further improvement with regard to the suppression of lateral dopant diffusion is obtained by a design measure in the gate structure. When the polysilicon layer is structured, a constriction is created in the connection between gate electrodes of n-channel and p-channel MOS transistors. The width of the connection in the region of the constriction is smaller than outside the latter and less than the average grain diameter of the polysilicon layer. The constriction is preferably situated in the region in which $n^+$-doped polysilicon adjoins $p^+$-doped polysilicon.

The invention utilizes the fact that the diffusion in the silicon grains takes place in a manner corresponding to the diffusion in monocrystalline silicon, and is thus greatly reduced in comparison with diffusion via grain boundaries. Since the average grain size of the polysilicon layer is greater than the smallest dimension in the gate structure, diffusion can take place only in the silicon grains at this location of the smallest dimension, since there is no grain boundary here.

The integrated CMOS circuit is preferably formed in a semiconductor substrate having monocrystalline silicon at least in the region of the CMOS circuit. In this case, the semiconductor substrate may be either a monocrystalline silicon wafer or a monocrystalline silicon layer of an SOI substrate.

Insulation structures for defining the active regions for the n-channel MOS transistor and the p-channel MOS transistor are formed in the semiconductor substrate. These insulation structures are formed using a LOCOS method with regard to customary logic processes. However, the insulation structures can also be formed in a different way, for example by means of a trench filled with insulating material.

It lies within the scope of the present invention to produce a p-doped well in the active region for accommodating the n-channel MOS transistor and an n-doped well in the active region for accommodating the p-channel MOS transistor.

Additional features and advantages of the present invention are described, and will be apparent from, the detailed description of the presently preferred embodiments and from the drawings.

DETAILED DESCRIPTION OF THE PREFERRED EMBODIMENTS

Figure 1:
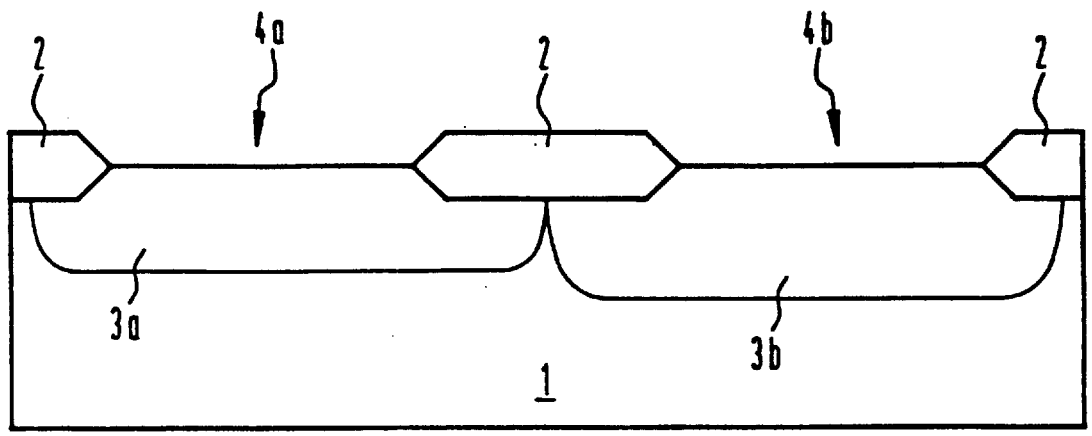
FIG. 1 shows a substrate with insulation structures for defining active regions for an n-channel MOS transistor and a p-channel MOS transistor after the formation of correspondingly doped wells.

In a substrate 1 made of monocrystalline silicon, for example, field oxide regions 2 which define an active region 4a for a p-channel MOS transistor and an active region 4b for an n-channel MOS transistor are produced using a LOCOS method, (see FIG. 1). An n-doped well 3a is produced in the active region 4a for the p-channel MOS transistor. A p-doped well 3b is produced in the active region 4b for the n-channel MOS transistor. The field oxide regions 2 and the wells 3a, 3b are produced according to process steps which are customary in CMOS technology. A dopant concentration of $1 \times 10^{17}$ P/cm$^3$, for example, is set in the n-doped well 3a, and a dopant concentration of $1 \times 10^{17}$ B/cm$^3$, for example, is set in the p-doped well 3b.

Figure 2:
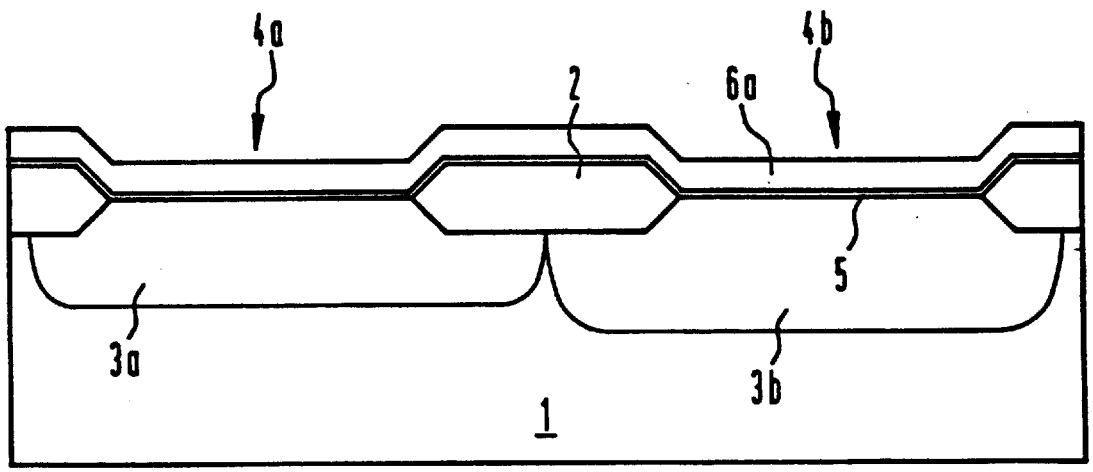
FIG. 2 shows the substrate of FIG. 1 after the formation of a gate oxide and the deposition of an amorphous silicon layer.

A gate oxide 5 is grown to a thickness of 3 to 10 nm, for example, by means of thermal oxidation at 900° C., (see FIG. 2). An amorphous silicon layer 6a is subsequently deposited over the whole area. The amorphous silicon layer 6a is deposited using low temperature deposition at a temperature of below 500° C., preferably in the range of 0.1–10 torr using disilane ($Si_2H_6$). This low temperature deposition process has the advantage over an $SiH_4$ process in that the amorphous silicon layer 6a exhibits an improved crystallization behavior. The amorphous silicon layer 6a is produced either without doping or with a slight doped with a dopant concentration of less than $5 \times 10^{19}$ cm$^{-3}$ with a layer thickness of 50 to 500 nm.

Figure 3:
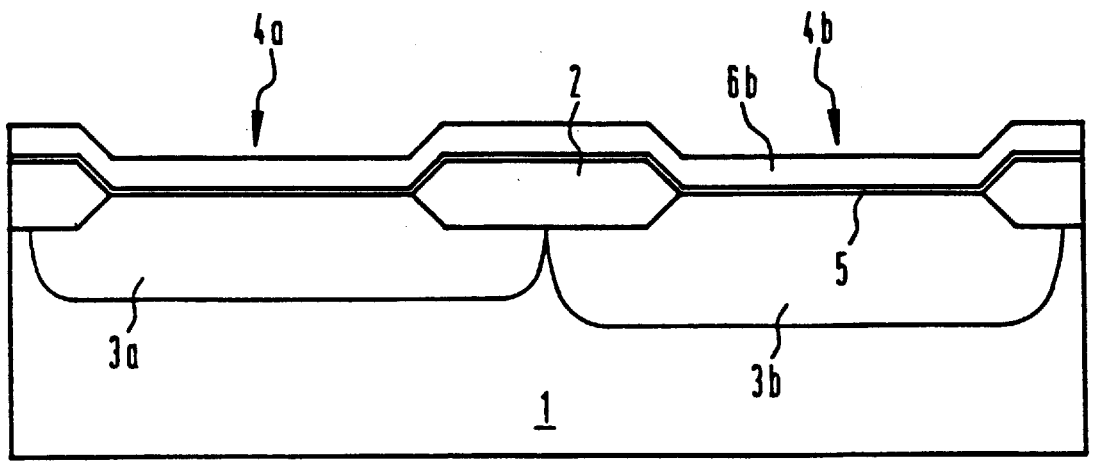
FIG. 3 shows the substrate of FIG. 2 after the formation of a polysilicon layer by crystallization of the amorphous silicon layer.
Figure 4:
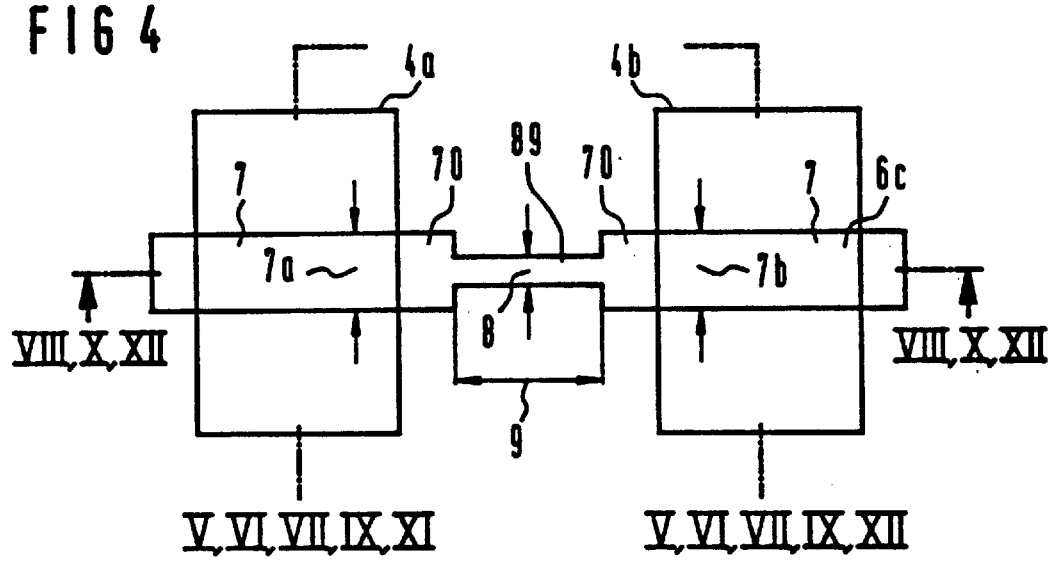
FIG. 4 shows a plan view of the substrate of FIG. 3 after the formation of a gate structure by structuring the polysilicon layer.
Figure 5:
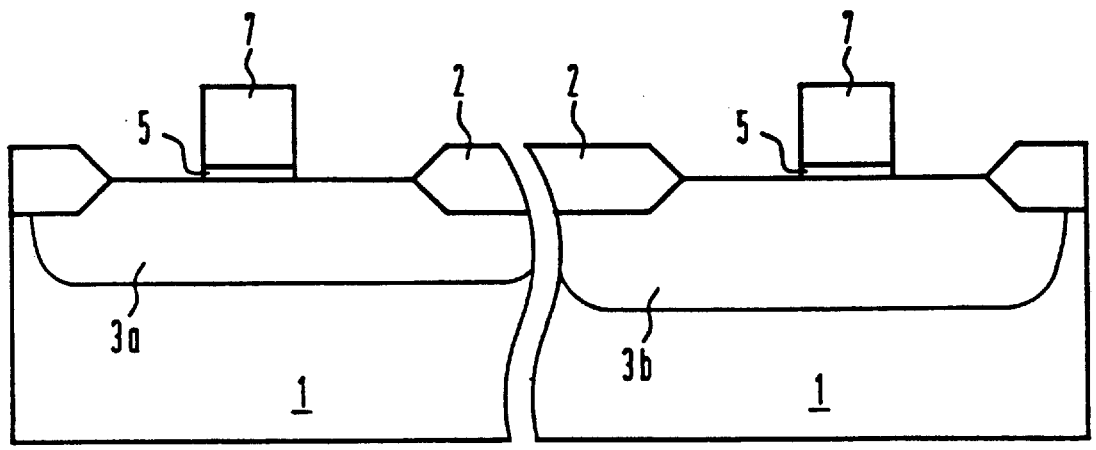
FIG. 5 shows a cross section along lines V—V of FIG. 4 through the semiconductor substrate after the structuring of the polysilicon layer and of the gate oxide.

The amorphous silicon layer 6a is subsequently converted into a polysilicon layer 6b by crystallization at a low temperature, preferably between 600° and 800° C. (see FIG. 3). The polycrystalline silicon layer 6b is composed of large-grain polysilicon with an average grain size <L> of preferably >200 nm. The average grain size <L> can be set by way of the heat-treatment conditions, that is to say temperature and duration of the crystallization. With heat-treatment conditions of 600° C., 8 hours, it is possible to obtain an average grain size of several μm. The polysilicon layer 6b is structured with the aid of a photolithographically produced mask and an etching technique; for example by means of anisotropic etching using HBr/Cl$_2$ gas. A gate structure 6c, which includes, in addition to undoped gate electrodes 7 for the p-channel MOS transistor and the n-channel MOS transistor, a connection 70 between the two gate electrodes 7, is formed in the process. The connection 70 includes a constriction 89 at which the width of the connection 70 is reduced. The width 8 is 250 nm, for example, in the region of the constriction 89. Outside the constriction 89, the width of the connection 70 corresponds to the width 7a, 7b of the gate electrodes 7, which is equal to the gate length of the p-channel MOS transistor and of the n-channel MOS transistor, respectively (see FIG. 4).

Figure 6:
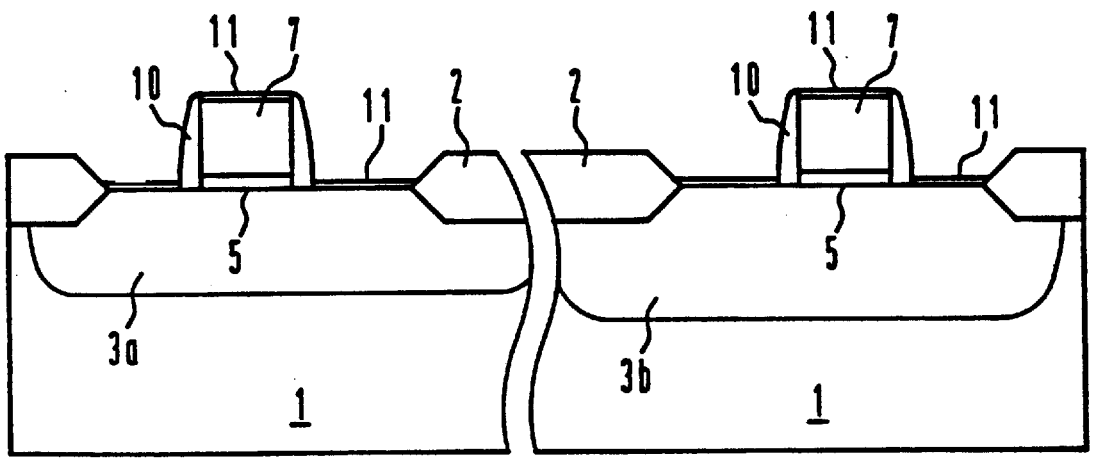
FIG. 6 a cross section along lines VI—VI of FIG. 4 through the semiconductor substrate after the formation of spacers and reoxidation.

The width 8 of the constriction 89 is set such that it is smaller, preferably significantly smaller, than the average grain size <L>. The length 9 of the constriction 89, on the other hand, is set such that it is greater than the average grain size <L> of the polysilicon. It is ensured in this way that lateral dopant diffusion takes place almost exclusively in the silicon grains in the region of the constriction 89. The width 8 and the length 9 of the constriction 89 are set in dependence on the polysilicon grain size, the thermal budget as well as on boundary conditions relating to design and lithography. At an average grain size <L> of 400 nm, for example, the width 8 is 250 nm, the length 9 is 800 nm and the gate length 7a, 7b is 1 μm, The undoped gate electrodes 7 are subsequently provided with SiO$_2$ spacers 10 by means of conformal deposition of an SiO$_2$ layer and anisotropic etching back of the SiO$_2$ layer using CHF$_3$/Ar, for example. A thermal oxide layer 11 is produced to a thickness of 15 nm on exposed silicon surfaces by means of thermal oxidation at 900° C., for example (see FIG. 6).

Figure 7:
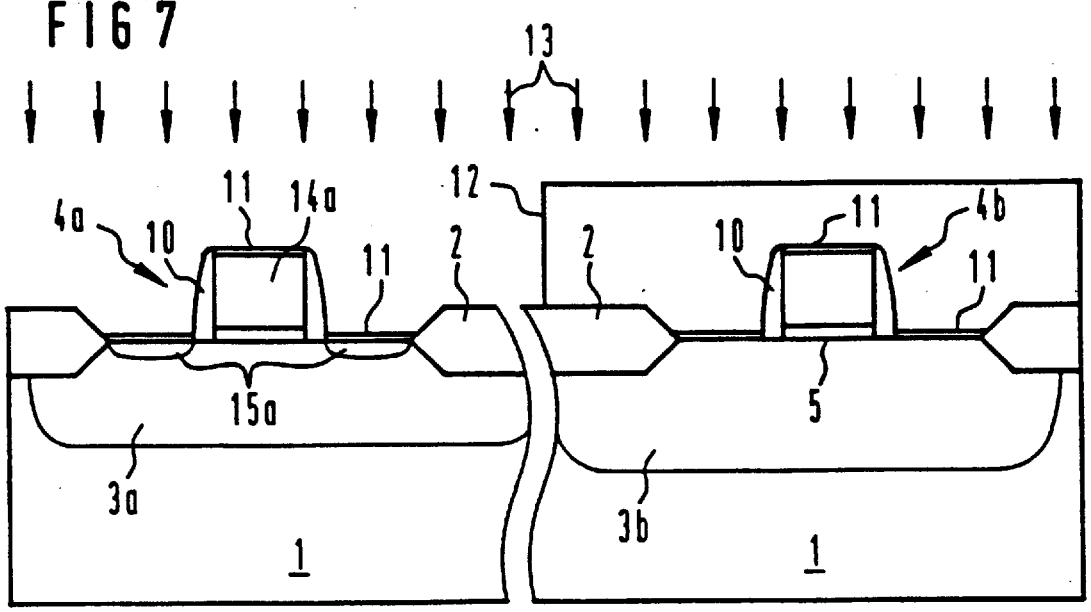
FIG. 7 and FIG. 8 show mutually perpendicular sections along lines VII—VII and VIII—VIII respectively, of FIG. 4 through the semiconductor substrate after p-ion implantation.
Figure 8:
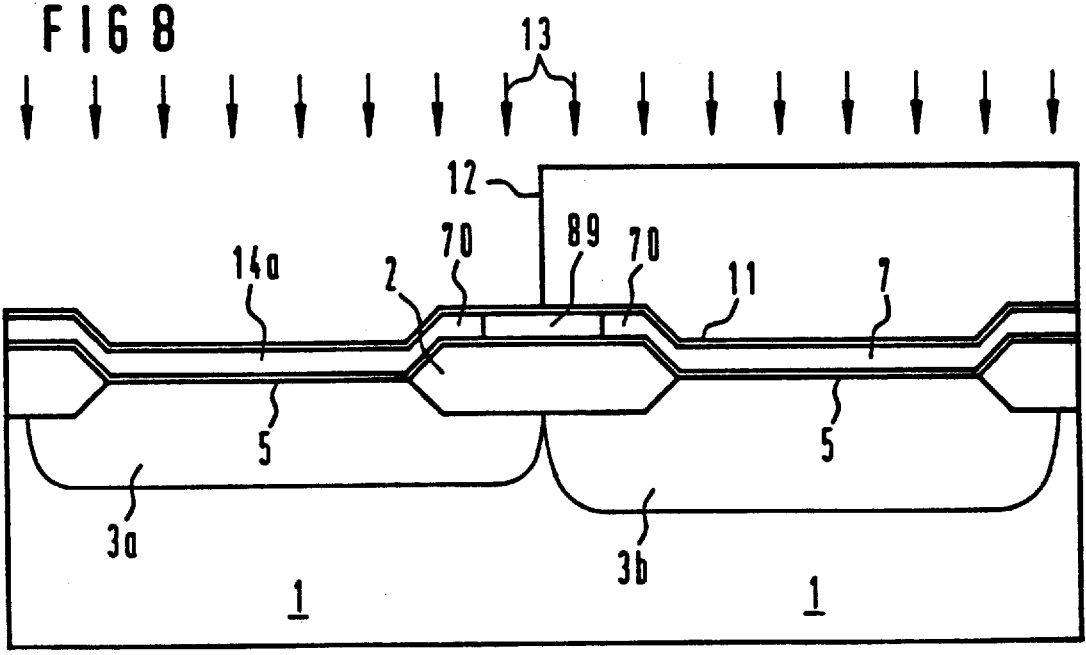

A photoresist mask 12, which covers the active region 4b for the n-channel MOS transistor, is subsequently produced with the aid of photolithographic process steps (see FIG. 7). In this case, the photoresist mask 12 reaches as far as the adjacent field oxide regions 2. The photoresist mask 12 reaches right into the region of the constriction 89 (see FIG. 8). A p$^+$-doped gate electrode 14 and also p-doped source/drain regions 15a are produced for the p-channel mass transistor by means of ion implantation 13 with boron or BF$_2$ with a dose of $5 \times 10^{15}$ at/cm$^2$, for example, and an energy of, for example, 15 and 40 keV, respectively. At the same time, that part of the connection 70 which is not covered by the photoresist mask 12 is p$^+$-doped.

Figure 9:
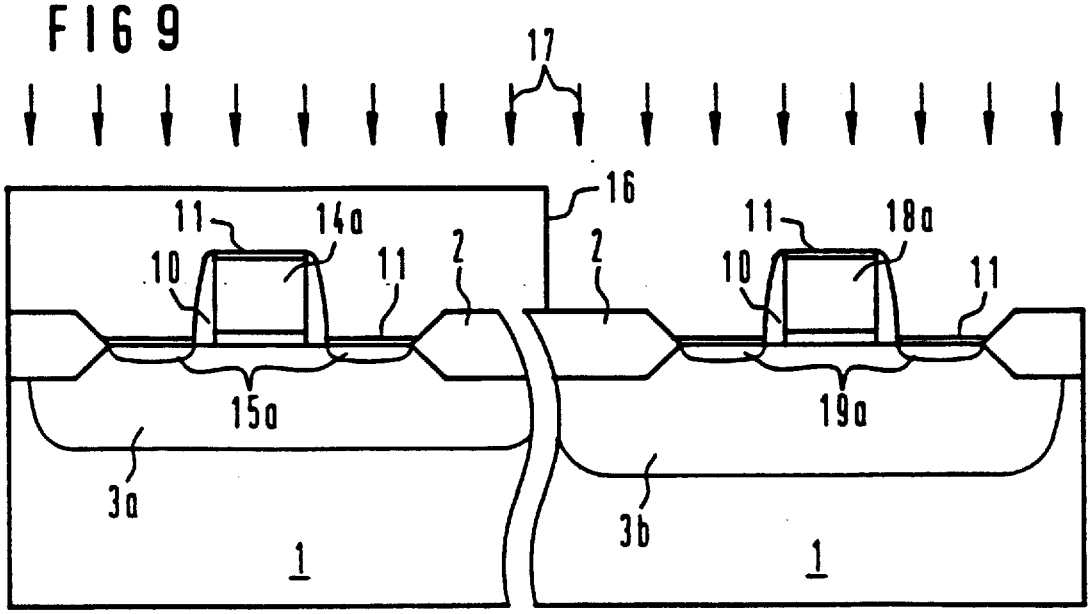
FIG. 9 and FIG. 10 show mutually perpendicular sections along lines IX—IX and X—X, respectively, of FIG. 4 through the semiconductor substrate after n-ion implantation.
Figure 10:
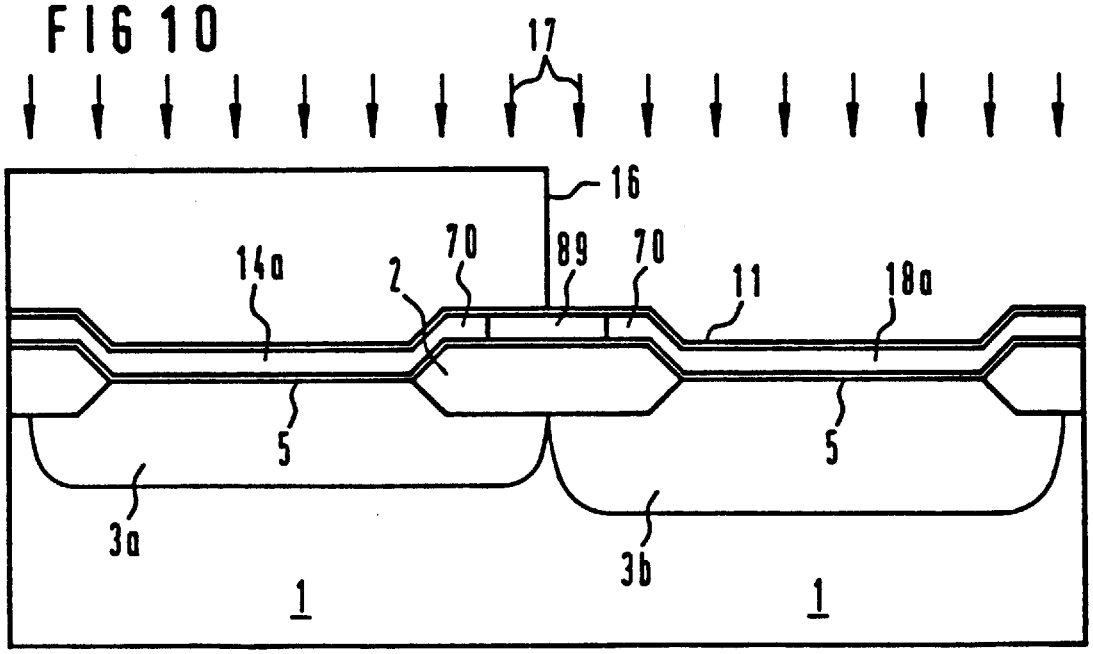

After the removal of the resist mask 12, a photoresist mask 16 is produced which covers the region for the p-channel MOS transistor (see FIG. 9). In the region of the connection 70, the photoresist mask 16 reaches as far as the constriction 89 (see FIG. 10). An n$^+$-doped gate electrode 18a and also n-doped source/drain regions 19a are formed by means of implantation 17 with arsenic or phosphorus with a dose of $5 \times 10^{15}$ at/cm$^2$ and an energy of 60 and 120 keV, respectively. During the implantation 17, that part of the connection 70 and of the constriction 89 which is not covered by the photo-resist mask 16 is n$^+$-doped.

The photoresist mask 16 is subsequently removed.

The implanted dopant is electrically activated by subjecting the substrate 1 to a heat treatment. p-doped source/drain diffusion regions 15b and n-doped source/drain diffusion regions 19b are formed in the process.

Figure 11:
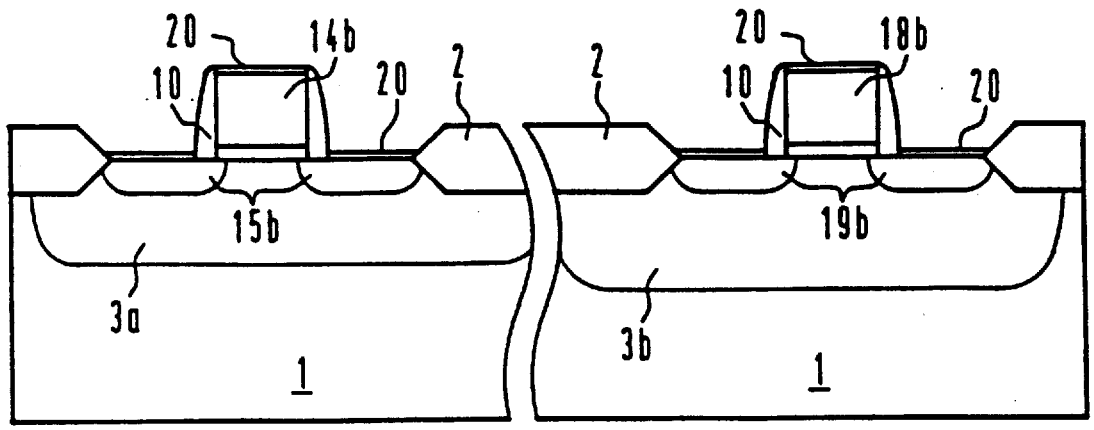
FIG. 11 and FIG. 12 show mutually perpendicular sections along lines XI—XI and XII—XII, respectively, of FIG. 3 through the semiconductor substrate after the completion of an n-channel MOS transistor and of a p-channel MOS transistor.
Figure 12:
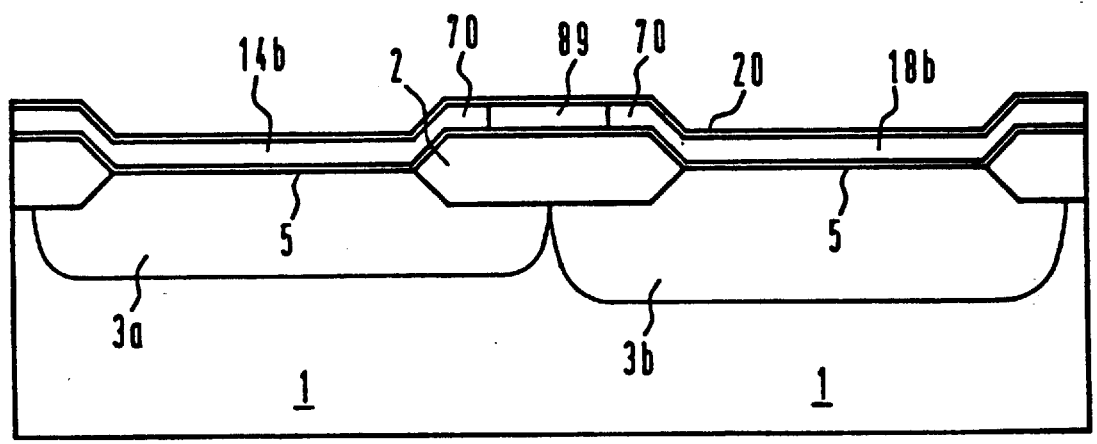

Furthermore, a p-doped gate 14b is produced for the p-channel MOS transistor and an n-doped gate 18b is produced for the n-channel MOS transistor (see FIG. 11 and FIG. 12).

The thermal SiO$_2$ layer 11 is removed by wet-chemical means, for example using HF/HNO$_3$. Afterwards, a metallic conductor 20 is applied selectively to exposed silicon areas, that is to say on the surface of the n-doped and, respectively, p-doped source/drain diffusion regions 15b, 19b and on the n-doped and, respectively, p-doped gate 18b, 14b. The metallic conductor 20 may be formed from TiSi$_2$ using a salicide method, for example. Furthermore, the metallic conductor 20 may be applied by selective deposition of tungsten using a CVD method. The metallic conductor 20 also extends over the connection 70 with the constriction 89. n$^+$-doped and p$^+$-doped regions of the connection 70 adjoin one another in the region of the constriction 89. The metallic conductor 20 runs over this boundary and connects the n$^+$-doped regions of the connection 70 to the p$^+$-doped regions.

Owing to the grain size of the polysilicon layer, no appreciable lateral diffusion occurs during the heat treatment for activating the dopant in the region of the constriction 89. A well-defined boundary between n$^+$-doped and p$^+$-doped regions of the connection 70 is preserved in the region of the constriction 89. The p$^+$-doped gate 14b is connected to the n$^+$-doped gate 18b. The structure constitutes an invertor.

The circuit arrangement is completed by the deposition of a layer of borophosphorus silicate glass and planarization, also by etching contact holes and metallization (not specifically illustrated).

Although the present invention has been described with reference to specific embodiments, those skilled in the art will recognize that changes may be made thereto without departing from the spirit and scope of the invention as set forth in the hereafter appended claims.

We claim:

1. A method for producing an integrated CMOS circuit, comprising the steps of:
    producing insulation structures in a semiconductor substrate, wherein each structure defines active regions for at least one n-channel MOS transistor and one p-channel MOS transistor;
    forming n-doped source/drain regions for the at least one n-channel MOS transistor;
    forming p-doped source/drain regions for the at least one p-channel MOS transistor;
    forming a gate oxide over the insulation structures;
    producing a polysilicon layer over the gate oxide;
    forming a gate structure by structuring the polysilicon layer, the gate structure including a first gate electrode for the n-channel MOS transistor and a second gate electrode for the p-channel MOS transistor as well as a connection between the first and second gate electrodes;
    providing at least a surface of the gate structure with a metallic conductor; and
    wherein the polysilicon layer is produced with a grain size such that an average grain diameter is greater than a width of a narrowed or constriction part of the connection between the first and second gate electrodes of the gate structure and wherein the first gate electrode is n-doped and the second gate electrode is p-doped.

2. A method for producing an integrated CMOS circuit as claimed in claim 1, further comprising the step of:
    depositing an amorphous silicon layer over the gate oxide for the purpose of forming the polysilicon layer by crystallization in a heat treatment step.

3. A method for producing an integrated CMOS circuit as claimed in claim 2, further comprising the steps of:
    depositing the amorphous silicon layer using Si$_2$H$_6$ as process gas in a temperature range between 400° C. and 500° C.; and
    carrying out the heat-treatment step for crystallization in a temperature range between 600° C. and 800° C.

4. A method for producing an integrated CMOS circuit as claimed in claim 1, further comprising the step of:
    providing the connection between the first and second gate electrodes with a constriction part.

5. A method for producing an integrated CMOS circuit as claimed in claim 1, further comprising the steps of:
    effecting the doping of the first gate electrode by implantation with n-doping ions, the n-doped source/drain regions being formed simultaneously; and
    effecting the doping of the second gate electrode by implantation with p-doping ions, the p-doped source/drain regions being formed simultaneously.

6. A method for producing an integrated CMOS circuit as claimed in claim 1, further comprising the step of:
    forming the insulation structures using a LOCOS method.

7. A method for producing an integrated CMOS circuit as claimed in claim 4, further comprising the steps of:
    producing a p-doped well in the active region for forming the n-channel MOS transistors; and
    producing an n-doped well in the active region for forming the p-channel MOS transistors.

* * * * *